US009110642B2

(12) United States Patent
Brey et al.

(10) Patent No.: US 9,110,642 B2
(45) Date of Patent: Aug. 18, 2015

(54) OPTIMIZATION OF SYSTEM ACOUSTIC SIGNATURE AND COOLING CAPACITY WITH INTELLIGENT USER CONTROLS

(75) Inventors: Thomas M. Brey, Cary, NC (US);
Vinod Kamath, Raleigh, NC (US);
Jason A. Matteson, Raleigh, NC (US);
Billy W. Medlin, Cary, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 430 days.

(21) Appl. No.: 13/274,835

(22) Filed: Oct. 17, 2011

(65) Prior Publication Data
US 2013/0096720 A1 Apr. 18, 2013

(51) Int. Cl.
*G06F 1/20* (2006.01)
*H05K 7/20* (2006.01)
*G06F 1/32* (2006.01)

(52) U.S. Cl.
CPC .............. *G06F 1/206* (2013.01); *G06F 1/3206* (2013.01); *H05K 7/20209* (2013.01); *H05K 7/20718* (2013.01); *Y02B 60/1275* (2013.01)

(58) Field of Classification Search
None
See application file for complete search history.

(56) References Cited

U.S. PATENT DOCUMENTS

| | | | | |
|---|---|---|---|---|
| 6,134,667 | A * | 10/2000 | Suzuki et al. | 713/300 |
| 6,314,473 | B1 * | 11/2001 | Singer et al. | 710/5 |
| 6,360,185 | B1 * | 3/2002 | Futawatari | 702/182 |
| 6,601,168 | B1 * | 7/2003 | Stancil et al. | 713/100 |
| 6,643,128 | B2 * | 11/2003 | Chu et al. | 361/679.48 |
| 6,725,132 | B2 * | 4/2004 | Frankel et al. | 700/300 |
| 6,931,306 | B2 * | 8/2005 | Frankel et al. | 700/300 |
| 6,935,130 | B2 * | 8/2005 | Cheng et al. | 62/259.2 |
| 6,996,441 | B1 * | 2/2006 | Tobias | 700/44 |
| 7,434,171 | B2 | 10/2008 | Clapper | |
| 7,708,056 | B2 * | 5/2010 | Shen et al. | 165/247 |
| 7,721,120 | B2 * | 5/2010 | Bodner et al. | 713/300 |
| 7,974,743 | B2 * | 7/2011 | Nakashima et al. | 700/299 |
| 8,122,265 | B2 * | 2/2012 | Radhakrishnan et al. | 713/300 |

(Continued)

FOREIGN PATENT DOCUMENTS

| | | |
|---|---|---|
| CN | 1010561703 A | 10/2009 |
| JP | 2010039655 A | 2/2010 |
| KR | 2006073917 A | 6/2006 |

OTHER PUBLICATIONS

Ayoub, et al. "Cool and Save: Cooling Aware Dynamic Workload Scheduling in Multi-socket CPU Systems", Department of Computer Science and Engineering, University of California, San Diego, IEEE (10C-4), 2010, pp. 891-896.

(Continued)

*Primary Examiner* — Darrin Dunn
*Assistant Examiner* — Christopher E Everett
(74) *Attorney, Agent, or Firm* — Katherine S. Brown; Jeffrey L. Streets (57) ABSTRACT

A computer-implemented method comprises accessing historical operating data for a unit of information technology equipment, wherein the historical operating data includes power consumption, fan speed, inlet air temperature, workload, and any processor throttling events at various points in time. The method further comprises receiving user input selecting a fan speed, and using the historical operating data to determine a performance impact that is expected from operating the unit at the selected fan speed, where the power consumption is a proxy for performance. The estimated performance impact of the selected fan speed and one or more alternative fan speeds is then displayed.

25 Claims, 3 Drawing Sheets

(56) References Cited

U.S. PATENT DOCUMENTS

| | | | |
|---|---|---|---|
| 8,140,195 B2* | 3/2012 | Matteson et al. | 700/299 |
| 2002/0067368 A1 | 6/2002 | Colligan et al. | |
| 2003/0120394 A1* | 6/2003 | Ziarnik | 700/300 |
| 2003/0234625 A1* | 12/2003 | Frankel et al. | 318/268 |
| 2004/0120113 A1 | 6/2004 | Rapaich | |
| 2004/0228091 A1* | 11/2004 | Miyairi | 361/695 |
| 2005/0030171 A1* | 2/2005 | Liu et al. | 340/500 |
| 2005/0049729 A1* | 3/2005 | Culbert et al. | 700/50 |
| 2005/0217300 A1* | 10/2005 | Cheng et al. | 62/259.2 |
| 2005/0289372 A1 | 12/2005 | Park | |
| 2008/0184047 A1 | 7/2008 | Goeltzenleuchter | |
| 2009/0002939 A1* | 1/2009 | Baugh et al. | 361/687 |
| 2009/0092261 A1 | 4/2009 | Bard | |
| 2009/0299544 A1* | 12/2009 | Tanada et al. | 700/300 |
| 2010/0286956 A1* | 11/2010 | Vangilder et al. | 702/182 |
| 2011/0051357 A1* | 3/2011 | Orr et al. | 361/679.48 |
| 2011/0133944 A1* | 6/2011 | Homer et al. | 340/635 |
| 2011/0176275 A1* | 7/2011 | Sato | 361/695 |
| 2012/0010754 A1* | 1/2012 | Matteson | 700/282 |

OTHER PUBLICATIONS

Asustek Comp, Inc., "Method for Controlling Rotating Speed of Fan and Computer System", English abstract of CN101561703A, Oct. 21, 2009, 1 page.

ghacks.net, "Lower the noise of your hard drives", http://www.ghacks.net/2007/11/03/lower-the-noise-of-your-hard-drives, Apr. 4, 2011, 3 pages.

Lenovo Singaporte PTE Ltd, "Heat Dissipation System for Computer", English abstract of JP2010039655A, Feb. 18, 2010, 1 page.

* cited by examiner

OPTIMIZATION OF SYSTEM ACOUSTIC SIGNATURE AND COOLING CAPACITY WITH INTELLIGENT USER CONTROLS

BACKGROUND

1. Field of the Invention

The present invention relates to methods of managing the performance of information technology equipment, such as computer servers.

2. Background of the Related Art

Computer systems typically include a number of electronic components disposed within a chassis. These components generate heat as a byproduct of electrical power consumption, and require a cooling system to prevent the components from becoming damaged. A common cooling system includes one or more fans for driving airflow through the chassis across the electronic components. For example, a personal computer (PC) or server may include one or more onboard fans provided inside the chassis of the PC or server. In larger computer systems, such as in a rack-mounted computer system, a shared blower module having multiple fans may be provided in a chassis for cooling multiple servers mounted in the chassis. For larger computer systems, such as in a datacenter, a more comprehensive cooling system may include a dedicated computer room having specialized HVAC equipment and a particular arrangement of racks that includes alternating hot and cold aisles.

The large, high-speed fans and blower modules used for cooling servers and other information technology equipment are the primary source of noise in the datacenter. A datacenter includes many densely-packaged rack-mounted servers and corresponding fans. The combined noise of the many fans and blower modules in a datacenter produce an undesirable level of noise. Additionally, the many fans and blower modules in a datacenter contribute significantly to the power consumption of the datacenter. Unfortunately, limiting or reducing the amount of airflow through the computer system can require a reduction in processor load, causing the computer to run at less than its full processing capacity.

In order to allow such large computer systems to operate at full processing capacity or performance, the data center may be physically separated from office spaces to reduce the noise and discomfort experienced by employees. There may also be need for a general policy that noise levels must be reduced below certain user-defined limits whenever an administrator or other person must enter into the data center.

BRIEF SUMMARY

One embodiment of the present invention provides a computer-implemented method, comprising accessing historical operating data for a unit of information technology equipment, wherein the historical operating data includes power consumption, fan speed, inlet air temperature, workload, and any processor throttling events at various points in time. The method further comprises receiving user input selecting a fan speed ranging from a minimum fan speed to a maximum fan speed, and using the historical operating data to determine a performance impact that is expected from operating the unit at the selected fan speed, where the power consumption is a proxy for performance. The estimated performance impact of the selected fan speed and one or more alternative fan speeds is then displayed.

Another embodiment of the invention provides a computer program product including computer usable program code embodied on a computer usable storage medium. The computer program product comprises computer usable program code for accessing historical operating data for a unit of information technology equipment, wherein the historical operating data includes power consumption, fan speed, inlet air temperature, workload, and any processor throttling events at various points in time. In addition, the computer program product comprises computer usable program code for receiving user input selecting a fan speed ranging from a minimum fan speed to a maximum fan speed, and computer usable program code for using the historical operating data to determine a performance impact that is expected from operating the unit at the selected fan speed, where the power consumption is a proxy for performance. Still further, the computer program product comprises computer usable program code for displaying the estimated performance impact of the selected fan speed and one or more alternative fan speeds.

DETAILED DESCRIPTION

One embodiment of the present invention provides a computer-implemented method, comprising accessing historical operating data for a unit of information technology equipment, wherein the historical operating data includes power consumption, fan speed, inlet air temperature, workload, and any processor throttling events at various points in time. The method further comprises receiving user input selecting a fan speed ranging from a minimum fan speed to a maximum fan speed, and using the historical operating data to determine a performance impact that is expected from operating the unit at the selected fan speed, where the power consumption is a proxy for performance. The estimated performance impact of the selected fan speed and one or more alternative fan speeds is then displayed.

The historical operating data is acquired and stored over some period of time during which the unit of information technology equipment was operating. This data is typically available to the Baseboard Management Controller (BMC) or other service processor and may be stored in memory accessible to the BMC or other service processor. The operating data may be acquired continuously, periodically, or in response to some event or condition. For example, operating data may be acquired and stored in response to a thermal event that leads to a reduction in the processor frequency or voltage. It is also possible to acquire and store regular periodic operating data, supplemented by event-triggered acquisition and storage of operating data. In this manner, the amount of operating data may be reduced, yet the data remains representative of all operating periods and does not miss a short-term event that might provide evidence of important unit limitations. Still further, an operating data stream may be acquired and used to update the values of various system parameters or statistics without necessarily storing the operating data itself. Other data handling and storage processes may be evident to those having ordinary skill in the art after gaining an understanding of the present invention.

A user may select a fan speed ranging from a minimum fan speed to a maximum fan speed by providing input to a graphical user interface (GUI) generated by a computer program product. Accordingly, a user may use a peripheral device, such as a mouse or keyboard, to select a desired fan speed.

Once a fan speed has been selected, the historical operating data is used to determine a performance impact that is expected from operating at the selected fan speed. The estimated performance impact of the selected fan speed and one or more alternative fan speeds is then displayed. The level of analysis used to determine the performance impact may vary. For example, if the historical operating data includes data points collected when operating at an identical fan speed, then those data points may be used to show the level of performance that may be supported. If the historical operating data does not include such relevant data points, then an extrapolation may be used.

If the operating data does not include data directly reflecting processor performance or application performance, power consumption may be used as a proxy for performance. Accordingly, the method may determine a correlation between power consumption and performance of the unit using the historical operating data, and displaying a performance level that is correlated with the given power consumption.

The method may also determine a correlation between fan speed and sound levels using the historical operating data, and display to the user those sound levels that are correlated with the displayed fan speeds. Accordingly, the user can see the sound levels that are expected to result from their fan speed selection.

Optionally, if it is determined that first and second units of information technology equipment have similar hardware and amount of workload, historical operating data associated with the first device may be used to estimate a performance impact of implementing a selected fan speed on the second device. This may be helpful where the second device is newly installed and does not yet have its own historical operating data, yet since its hardware is identical it is expected to experience the same performance under similar conditions of fan speed, inlet air temperature, workload, and the like. Another benefit of one unit using the historical operating data from another unit is that the total amount of historical operating data may be kept small. In other words, it may be possible to acquire and store data for one representative unit of information technology equipment, such as a server, and use that data for the purpose of displaying the performance impact of a fan speed implemented across any number of identical or similar servers.

In one embodiment, the estimated performance impact of the selected fan speed is displayed as a graphical bar divided into performance zones. In one non-limiting example, the performance zones include first, second and third performance zones. The first performance zone illustrates the range of fan speeds or fan speed selector states that historically do not impact performance, the second performance zone illustrates the range of fan speeds or fan speed selector states that historically impact performance yet are above the historical average of fan speed, and the third performance zone illustrates a range of fan speeds or fan speed selector states that have historically prevented one or more jobs from being completed. Accordingly, the graphical bar would be divided into three zone, which are optionally given different color or patterns. In a preferred arrangement, the performances zones are aligned with the associated fan speeds or fan speed selector states. For example, if the range of fan speeds is displayed as a horizontal number line that is labeled with fan speed values, the graphical bar is a horizontal bar with each of the performance zones vertically aligned with the fan speeds over which the performance zone is associated.

In one specific embodiment, the unit of information technology equipment is an application specific integrated circuit (ASIC) and the fan is dedicated to the ASIC. Accordingly, an ASIC operating condition may be used as a proxy for the speed of the fan. The ASIC operating condition may be selected from the power consumption, temperature and performance of the ASIC. The methods described above may further comprise determining a correlation between the fan speed and an ASIC operating condition using the historical operating data, and displaying fan speeds that are correlated with the ASIC operating conditions.

The methods described herein may further comprise displaying a historical median of the actual fan speed of the system, and displaying a warning in response to detecting that the user has selected a fan speed that is less than the median fan speed. In certain embodiments, the warning will be displayed in response to detecting that the user has selected a fan speed selector state that will impose a fan speed that is less than the median fan speed. When the fan speed is less than the historical median fan speed, it is possible for performance to suffer to the extent that the system will be unable to finish some of its workload.

An optional second graphical bar may be displayed, where the second graphical bar is divided into performance zones that are aligned with the fan speeds or fan speed selector states associated with the performance zones. In this optional second graphical bar, the performance zones are determined from the historical operating data associated with the highest measured inlet air temperature. As with the graphical bar previous discussed and with other graphical bars discussed herein, the performances zones are preferably aligned with the associated fan speeds. For example, if the range of fan speeds is displayed as a horizontal number line that is labeled with fan speed values, the graphical bar is preferably a horizontal bar with each of the performance zones vertically aligned with the fan speeds over which the performance zone is associated. Accordingly, the optional second graphical bar provides a visual indication of the relative performance impact that may occur if the inlet air temperature were to reach the highest measure inlet air temperature in the historical operating data. If the administration views that the inlet air temperature might possibly reach this level, then the second graphical bar facilitates an understanding of the resulting performance impact.

Alternatively, a second graphical bar may be divided into performance zones that are determined from the historical operating data associated with the highest inlet air temperature range that is supported. An inlet air temperature is "supported" if the systems, such as a server, can operate at the specified inlet air temperature without negative performance implications. Still further, multiple graphical bars may be displayed, including both a graphical bar with performance zones associated with the highest support inlet air temperature, and a graphical bar with performance zones associated with the highest measured inlet air temperature.

The methods may further comprise determining one or more measure of variability in the inlet air temperature based upon the historical data, and displaying the one or more measure of variability in the inlet air temperature. For example, the one or more measure of variability in the inlet air temperature may include an inlet air temperature range and a median inlet air temperature.

In a still further embodiment of the computer-implemented method, the step of receiving user input selecting a fan speed ranging from a minimum fan speed to a maximum fan speed, includes receiving user input selecting one of a plurality of fan speed selector states ranging from a minimum fan speed to a maximum fan speed. The plurality of fan speed selector states are normalized values, wherein each fan speed selector state represents one of a plurality of fan speeds ranging from the minimum fan speed to the maximum fan speed.

Optionally, the method may allow a user to specify the number of fan speed selector states that are to be used. Accordingly, the method may further comprise receiving user input selecting a number of fan speed selector states, and establishing the selected number of fan speed selector states distributed across the full range of fan speeds from a minimum fan speed to a maximum fan speed, wherein each of the fan speed selector states is associated with a different fan speed.

In yet another embodiment, the method further comprises determining a relationship between the inlet air temperature and cooling capacity of the fans. The method may then estimate a loss in performance that is likely to occur at the selected fan speed selector state if the inlet air temperature reaches the highest inlet air temperature in the historical operating data or the highest inlet air temperature supported by the unit. Optionally, the cooling capacity as a function of inlet air temperature for each of the fan speed selector states may be displayed, such as in the form of a table.

Another embodiment of the invention provides a computer program product including computer usable program code embodied on a computer usable storage medium. The computer program product comprises computer usable program code for accessing historical operating data for a unit of information technology equipment, wherein the historical operating data includes power consumption, fan speed, inlet air temperature, workload, and any processor throttling events at various points in time. In addition, the computer program product comprises computer usable program code for receiving user input selecting a fan speed ranging from a minimum fan speed to a maximum fan speed, and computer usable program code for using the historical operating data to determine a performance impact that is expected from operating the unit at the selected fan speed, where the power consumption is a proxy for performance. Still further, the computer program product comprises computer usable program code for displaying the estimated performance impact of the selected fan speed and one or more alternative fan speeds. It should be recognized that other aspects of the computer-implemented methods described above may also be included in the computer program product by implementing appropriate computer usable program code. According, those aspects of the computer-implemented method are not repeated here.

The various embodiments of the invention provide performance information that allow users to make informed decisions about how to balance performance with acoustics and energy management objectives. Users are shown the effect that cooling has on performance, and the effect that ambient inlet air temperatures have on capacity limitations. In the upper regions of the acceptable inlet air temperature range, as the inlet temperature increases, the cooling capacity decreases, thereby lowering the amount of heat that can be removed and reducing overall performance since the system must reduce power consumption by slowing down.

Figure 1:
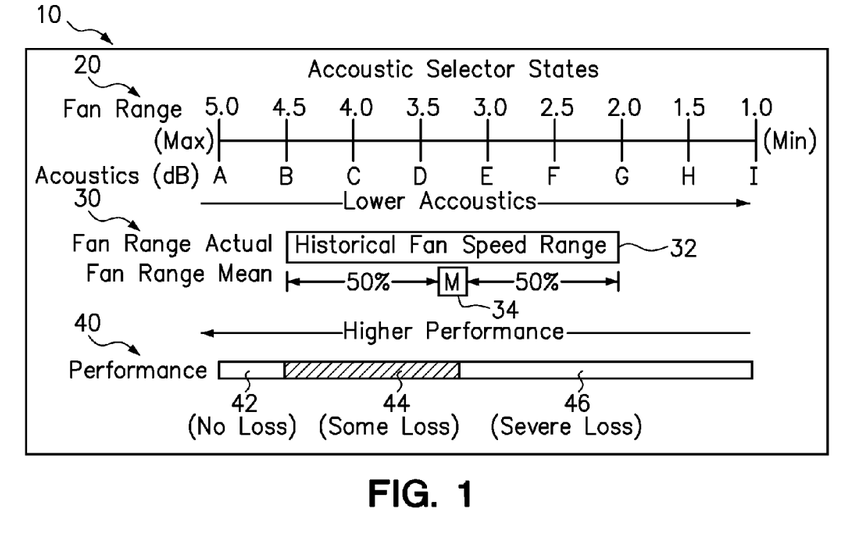
FIG. 1 is an illustration of a graphical user interface that shows the performance zones associated with selected fan speeds.

FIG. 1 is an illustration of a graphical user interface 10 that shows the performance zones associated with selected fan speeds. A fan range ("number line") 20 is provided for the purpose of showing the range of fan speeds available. In the embodiment shown, the fan range 20 includes fan speed selector states ranging from a minimum of 1.0 (right side) to a maximum of 5.0 (left side). The maximum fan speed selector state corresponds to the maximum fan speed and the maximum acoustic sound pressure (A). Conversely, the minimum fan speed selector state corresponds to the minimum fan speed and the minimum acoustic sound pressure (I). The fan speed may be in units of rotations per minute (RPM) or other measure, and the acoustic sound pressure emitted by the fans may be in units of decibels (dB) or other measure.

The historical operating data may be used to determine and display historical measures of the fan speed 30. The actual fan range uses a graphical bar 32 to display the historical fan speed range. The mean fan speed is displayed immediately below the graphical bar 32, but may be superimposed or otherwise displayed in associated with the fan speed range. Since the fan range 20 is being displayed as a horizontal number line, the graphical bar 32 is also a horizontal bar. Accordingly, the upper end (left side) of the graphical bar 32 is vertically aligned with the fan speed selector state 4.5, and the low end (right side) of the graphical bar 32 is vertically aligned with the fan speed selector state 2.0. The graphical bar 32, which is based on the historical operating data, shows that the fans in this system have only been used in the range between 2.0 and 4.5, and that the mean fan speed is about 3.25.

Estimates of performance impact 40 are shown in the form of a graphical bar divided into three performance zones. A first zone 42 represents a range of fan speeds that cause "no loss" in performance, a second zone 44 represents a range of fan speeds that cause "some loss" in performance, and a third zone 46 represents a range of fan speeds that cause "severe loss" of performance. It can be seen that slowing down the fan speed below the mean point 34 has a 50% chance to impact performance at any point in time. Accordingly, the mean of the fan speed range 34 aligns with the demarcation between "some loss" of performance in the second zone 44 and "severe loss" of performance in the third zone 46.

Figure 2:
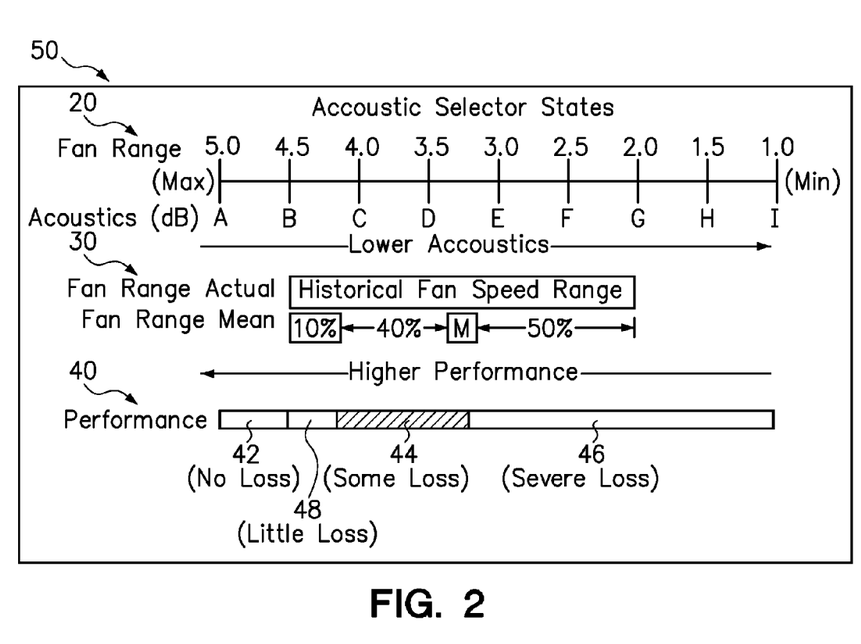
FIG. 2 is an illustration of the graphical user interface of FIG. 1 with an additional performance zone.

FIG. 2 is an illustration of a graphical user interface 50, similar to the GUI 10 of FIG. 1, with an additional zone 48 representing a range of fan speeds that may cause a "little loss" of performance. A user-defined policy may establish a fixed percentage of the time, here 10%, that the fans are allowed to operate at the high end of the fan speed range. As shown in FIG. 2, only 10% of the time the fans were between 4.5 and 4.0 in speed and that 90% of the time the system did not require fans at that speed.

Figure 3:
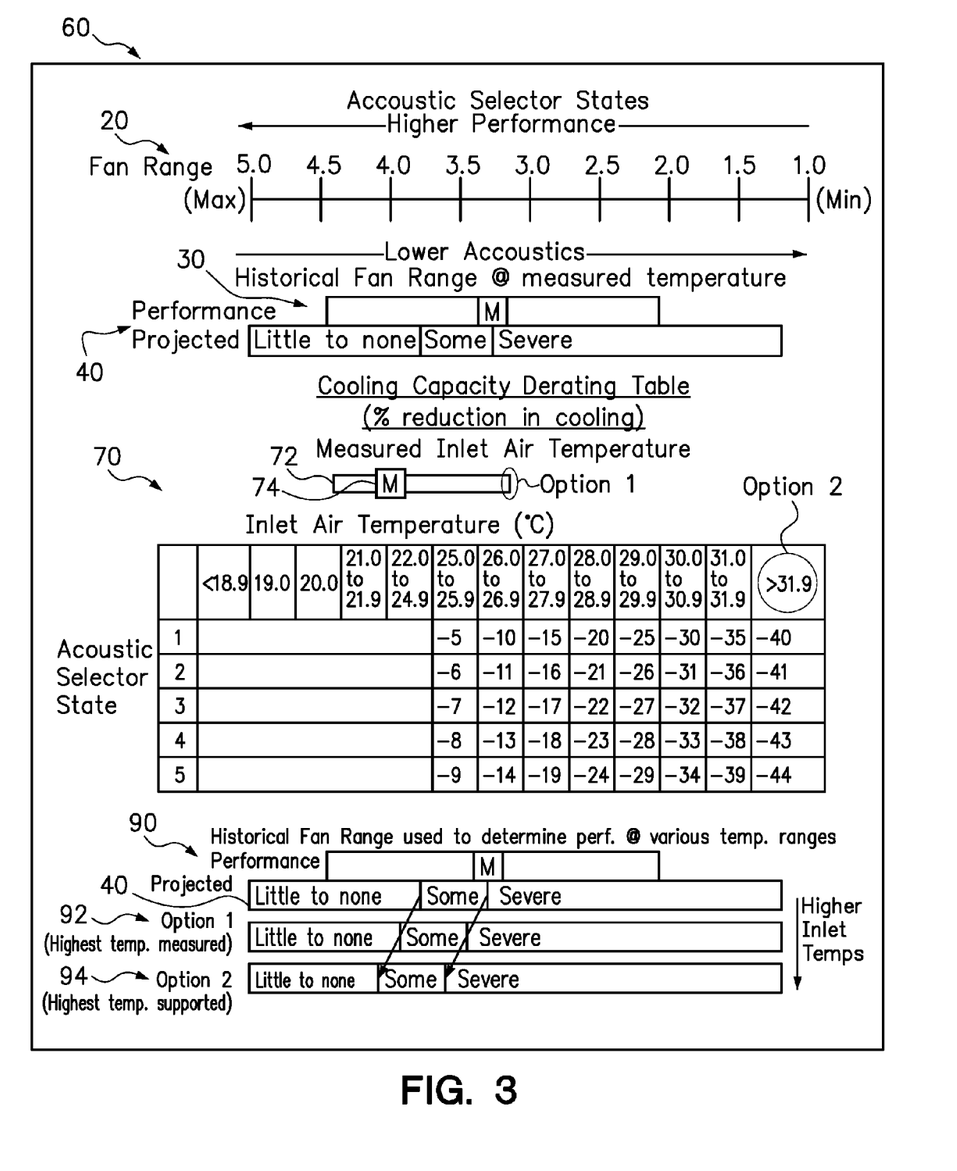
FIG. 3 is an illustration of a graphical user interface that includes a cooling capacity derating table.

FIG. 3 is an illustration of a graphical user interface 60 that includes a cooling capacity derating table 70 in addition to the fan speed range 20, the historical fan range 30, and the estimated performance impact 40. It should be recognized that the estimated performance impact 40 is determined with the assumption that the inlet air temperature will remain unchanged.

However, a user may desire to consider the implications of an increase or decrease in the inlet air temperature. The Cooling Capacity Derating Table 70 satisfies this need by indicating the loss of cooling capacity that occurs when systems are run with different inlet air temperatures. In other words, the table shows the amount of peak capacity that is lost at these higher inlet air temperatures. The values in the table must be uniquely determined for each system design. In the table 70, selecting the fan speed selector #3 (Acoustic Selector State 3) when the inlet air temperature is 25.5° C., will result in a loss of 7% of peak cooling capacity for the system represented by the table 70. Typically, systems do not provide for peak performance in these inlet temperature ranges because of cost limitations of increased cooling capacity.

In order to get an understanding of the historical inlet temperature range of the system, a graphical bar shows the inlet air temperature range 72 with a mean air temperature value 74 superimposed thereon. This mean value 74 indicates that half of the time the inlet air temperature was less than this value and half of the time the inlet air temperature was greater than this value.

Some users will operate IT equipment with the expectation that inlet air temperatures in the data center stay below the level where the cooling capacity begins to be derated (FIG. 2 shows a "derating temperature" as 25° C.). However, efforts to conserve on cooling costs may cause the inlet air temperature in a data center to rise above a derating temperature. In response to such realities, other users may want to plan their acoustic levels around the highest measured inlet air temperature (option 1). Yet other users may plant their acoustic levels around the highest inlet air temperature range that is supported (option 2). The graphical user interface (GUI) accommodates these two options by provide additional graphical bars 92, 94 that show the shift in performance zones that are expected to occur if the inlet air temperature reaches the highest temperature measured (See graphical bar 92) or the highest temperature supported (See graphical bar 94), respectively. The user can select one of these options or focus on one of these graphical bars, whichever is most consistent with management policy, through entry of user preferences.

For example, at the bottom of the graphical user interface 60, there are three graphical bars. The first graphical bar 40 is the same as the graphical bar 40 of FIGS. 1 and 2, and represents the performance zones at the current inlet air temperature. The second graphical bar 92 represents the performance zones at the highest inlet air temperature measured (according to the historical operating data). It can be seen that the "some loss" of performance zone moves leftward from the first graphical bar 40 to the second graphical bar 92. This means that there may be a decrease in performance for any given fan speed selector state if the inlet air temperature increases to the highest inlet air temperature measured. Similarly, the "some loss" of performance zone in the third graphical bar 94 moves even more leftward than the second graphical bar 92. This means that the decrease in performance for any given fan speed selector state is even greater if the inlet air temperature increases to the highest inlet air temperature supported.

By selecting the different fan speed selector states (acoustic selector states), you allow for more or less cooling capacity (maximum cooling allowed), given the ambient inlet temperature. For example, a user that desired to avoid "severe loss" of performance even if the inlet air temperature rose to the highest inlet air temperature supported, might select the fan speed selector state 4.0, rather that 3.5. While the fan speed selector state 3.5 is sufficient to avoid "severe loss" of performance at the current inlet air temperature or even the highest inlet air temperature measured, the fan speed selector state 4.0 is necessary to avoid "severe loss" of performance at the highest inlet air temperature supported.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method, comprising:
accessing historical operating data for a unit of information technology equipment, wherein the historical operating data includes power consumption, fan speed, inlet air temperature, workload, and any processor throttling events, the historical operating data being acquired continuously or periodically during a period of time in which the unit of information technology equipment was operating or in response to an event of the unit of information technology equipment occurring in the period of time;
receiving user input selecting a fan speed ranging from a minimum fan speed to a maximum fan speed;
using the historical operating data to determine a performance impact that is expected from operating the unit at the selected fan speed, where the power consumption is a proxy for performance; and
displaying the estimated performance impact of the selected fan speed and one or more alternative fan speeds.

2. The method of claim 1, further comprising:
determining a correlation between power consumption and performance of the unit using the historical operating data; and
displaying a performance that is correlated with the power consumption.

3. The method of claim 1, further comprising:
determining a correlation between fan speed and sound levels using the historical operating data; and
displaying sound levels that are correlated with the displayed fan speeds.

4. The method of claim 1, further comprising:
determining that first and second units of information technology equipment have similar hardware and workload; and
using historical operating data associated with the first device to estimate a performance impact of implementing a selected fan speed on the second device.

5. The method of claim 1, further comprising:
displaying the performance impact as a graphical bar divided into performance zones, wherein the performances zones are aligned with the associated fan speeds.

6. The method of claim 5, wherein the performance zones include at least a first performance zone illustrating the range of fan speeds that historically do not impact performance, a second performance zone illustrating the range of fan speeds that historically impact performance yet are above the historical average of fan speed, and a third performance zone illustrating a range of fan speeds that have historically prevented one or more jobs from being completed.

7. The method of claim 5, further comprising:
displaying a second graphical bar divided into performance zones that are aligned vertically with the selector states associated with the performance zone, wherein the performance zones in the second graphical bar are determined from the historical data associated with a highest measured inlet air temperature.

8. The method of claim 1, wherein the unit of information technology equipment includes a computer server.

9. The method of claim 1, wherein the unit of information technology equipment is an application specific integrated circuit (ASIC) and the fan is dedicated to the ASIC, wherein an ASIC operating condition is used as a proxy for the speed of the fan, and wherein the ASIC operating condition is selected from the power consumption, temperature and performance of the ASIC.

10. The method of claim 9, further comprising:
determining a correlation between the fan speed and an ASIC operating condition using the historical operating data; and
displaying fan speeds that are correlated with the ASIC operating conditions.

11. The method of claim 1, further comprising:
displaying a historical median of the actual fan speed of the system; and
displaying a warning in response to detecting that the user has selected a selector state that will impose a fan speed that is less than the median fan speed.

12. The method of claim 1, further comprising:
displaying a second graphical bar divided into performance zones that are aligned vertically with the selector states associated with the performance zone, wherein the performance zones in the second graphical bar are determined from the historical data associated with a highest inlet air temperature range that is supported.

13. The method of claim 1, further comprising:
determining one or more measure of variability in the inlet air temperature based upon the historical data; and
displaying the one or more measure of variability in the inlet air temperature.

14. The method of claim 13, wherein the one or more measure of variability in the inlet air temperature includes an inlet air temperature range and a median inlet air temperature.

15. The method of claim 1, wherein the step of receiving user input selecting a fan speed ranging from a minimum fan speed to a maximum fan speed, includes:
receiving user input selecting one of a plurality of fan speed selector states ranging from a minimum fan speed to a maximum fan speed.

16. The method of claim 15, wherein the plurality of fan speed selector states are normalized values representing a plurality of fan speeds ranging from the minimum fan speed to the maximum fan speed.

17. The method of claim 15, further comprising:
receiving user input selecting a number of fan speed selector states; and
establishing the selected number of fan speed selector states distributed across the full range of fan speeds from a minimum fan speed to a maximum fan speed, wherein each of the fan speed selector states is associated with a different fan speed.

18. The method of claim 15, further comprising:
displaying the performance impact as a graphical bar divided into performance zones, wherein the performances zones are aligned with the fan speed selector states associated with the performance zone.

19. The method of claim 18, where in the performance zones include at least a first performance zone illustrating the range of fan speed selector states that historically do not impact performance, a second performance zone illustrating the range of fan speed selector states that historically impact performance yet are above the historical average of fan speed, and a third performance zone illustrating a range of fan speed selector states that have historically prevented one or more jobs from being completed.

20. The method of claim 15, further comprising:
determining a relationship between inlet air temperature and cooling capacity of the fans;
estimating a loss in performance that is likely to occur at the selected fan speed selector state if the inlet air temperature reaches the highest inlet air temperature in the historical operating data or the highest inlet air temperature supported by the unit.

21. The method of claim 20, further comprising:
displaying the cooling capacity as a function of inlet air temperature for each of the fan speed selector states.

22. The method of claim 21, wherein the cooling capacity as a function of inlet air temperature for each of the fan speed selector states is displayed as a table.

23. A computer program product including computer usable program code embodied on a non-transitory computer readable storage medium, the computer program product comprising:
computer usable program code for accessing historical operating data for a unit of information technology equipment, wherein the historical operating data includes power consumption, fan speed, inlet air temperature, workload, and any processor throttling events, the historical operating data being acquired continuously or periodically during a period of time in which the unit of information technology equipment was operating or in response to an event of the unit of information technology equipment occurring in the period of time;
computer usable program code for receiving user input selecting a fan speed ranging from a minimum fan speed to a maximum fan speed;
computer usable program code for using the historical operating data to determine a performance impact that is expected from operating the unit at the selected fan speed, where the power consumption is a proxy for performance; and
computer usable program code for displaying the estimated performance impact of the selected fan speed and one or more alternative fan speeds.

24. The computer program product of claim 23, further comprising:
computer usable program code for displaying the performance impact as a graphical bar divided into performance zones, wherein the performances zones are aligned with the associated fan speeds.

25. The computer program product of claim 24, where in the performance zones include at least a first performance zone illustrating the range of fan speeds that historically do not impact performance, a second performance zone illustrating the range of fan speeds that historically impact performance yet are above the historical average of fan speed, and a third performance zone illustrating a range of fan speeds that have historically prevented one or more jobs from being completed.

* * * * *